(12) United States Patent
Tanaka et al.

(10) Patent No.: US 9,761,760 B2
(45) Date of Patent: Sep. 12, 2017

(54) SEMICONDUCTOR LIGHT EMITTING ELEMENT

(75) Inventors: Hidetoshi Tanaka, Anan (JP); Mitsumasa Takeda, Anan (JP)

(73) Assignee: NICHIA CORPORATION, Anan-shi (JP)

( * ) Notice: Subject to any disclaimer, the term of this patent is extended or adjusted under 35 U.S.C. 154(b) by 99 days.

(21) Appl. No.: 13/638,470

(22) PCT Filed: Mar. 24, 2011

(86) PCT No.: PCT/JP2011/057147
§ 371 (c)(1),
(2), (4) Date: Sep. 28, 2012

(87) PCT Pub. No.: WO2011/122433
PCT Pub. Date: Oct. 6, 2011

(65) Prior Publication Data
US 2013/0015470 A1 Jan. 17, 2013

(30) Foreign Application Priority Data

Mar. 31, 2010 (JP) .................................. 2010-079951
Sep. 28, 2010 (JP) .................................. 2010-217050

(51) Int. Cl.
*H01L 33/38* (2010.01)
*H01L 33/44* (2010.01)
H01L 33/00 (2010.01)

(52) U.S. Cl.
CPC .............. *H01L 33/38* (2013.01); *H01L 33/44* (2013.01); *H01L 33/0079* (2013.01)

(58) Field of Classification Search
CPC ..... H01L 33/0079; H01L 33/38; H01L 33/44; H01L 33/36
(Continued)

(56) References Cited

U.S. PATENT DOCUMENTS 7,956,368 B2 * 6/2011 Nagai .................... H01L 33/38
257/79
2010/0008391 A1 1/2010 Nakagawa et al.
(Continued)

FOREIGN PATENT DOCUMENTS

CN 101271917 9/2008
JP 01-198087 8/1989
(Continued)

OTHER PUBLICATIONS

International Preliminary Report on Patentability with Translation of Written Opinion of the International Searching Authority for corresponding International Application No. PCT/JP2011/057147, dated Nov. 1, 2012.
(Continued)

Primary Examiner — Julio J Maldonado
Assistant Examiner — Nga Doan
(74) Attorney, Agent, or Firm — Mori & Ward, LLP

(57) ABSTRACT

A semiconductor light emitting device in which adhesion between an insulating layer and a semiconductor layer is improved while maintaining the ability of the insulating layer to limit the direction of current flow. The semiconductor light emitting device includes a semiconductor layer, a first electrode and a second electrode arranged to interpose the semiconductor layer therebetween, an insulating layer provided to the semiconductor layer at the same side as the second electrode and opposite to the first electrodes so as to surround the periphery of the second electrode, a first metal layer covering the second electrode and the insulating layer, and a second metal layer which has a thickness smaller than the thickness of the second electrode and is provided between the semiconductor layer and the insulating layer.

19 Claims, 6 Drawing Sheets

(58) Field of Classification Search
USPC .................................................... 257/79, 98
See application file for complete search history.

(56) References Cited

U.S. PATENT DOCUMENTS

| | | | |
|---|---|---|---|
| 2011/0220928 A1* | 9/2011 | Muramoto ....................... | 257/94 |
| 2011/0291134 A1* | 12/2011 | Kang .................. | H01L 33/0079 |
| | | | 257/98 |
| 2013/0193467 A1* | 8/2013 | Kususe et al. .................. | 257/98 |

FOREIGN PATENT DOCUMENTS

| | | |
|---|---|---|
| JP | 11-126947 | 5/1999 |
| JP | 2002-335053 | 11/2002 |
| JP | 2008-147556 | 6/2008 |
| JP | 2009-231356 | 10/2009 |
| JP | 2010-062300 | 3/2010 |
| JP | 2011-066096 | 3/2011 |

OTHER PUBLICATIONS

International Search Report for corresponding International Application No. PCT/JP2011/057147, dated Apr. 19, 2011.
Taiwanese Office Action for corresponding TW Application No. 100110845, dated Oct. 8, 2013.

* cited by examiner (a)

(b)

SEMICONDUCTOR LIGHT EMITTING ELEMENT

REFERENCE TO RELATED APPLICATIONS

This application is a national stage application under USC 371 of International Application No. PCT/JP2011/057147, filed Mar. 24, 2011, which claims the priority of Japanese Patent Application No. 2010-079951, filed Mar. 31, 2010, and Japanese Patent Application No. 2010-217050, filed Sep. 28, 2010, the entire contents of which are incorporated herein by reference.

FIELD OF THE INVENTION

The present invention relates to a semiconductor light emitting element, in particular, a semiconductor light emitting element having an insulating layer which can control current flow.

BACKGROUND OF THE INVENTION

Semiconductor light emitting elements are widely used, as light emitting diodes (LED) and laser diodes (LD), for various light sources such as general lightings, traffic lights and large-sized displays, and required to exhibit high luminous efficiency. Therefore, a technology to improve luminous efficiency by providing an insulating layer which can control current flow within the semiconductor light emitting element and by injecting the current effectively to the semiconductor layer has been previously known.

For example, such semiconductor light emitting element comprises a multilayered semiconductor part having a first conductivity type semiconductor layer and a second conductivity type semiconductor layer, a first conductivity side electrode connected to the first conductivity type semiconductor layer and a second conductivity side electrode connected to the second conductivity type semiconductor layer, and an insulating layer is provided adjacent to the second conductivity side electrode on the second conductivity type semiconductor layer. And this semiconductor light emitting element is constructed by bonding a conductive substrate with the second conductivity side electrode and the insulating layer via a metal layer (see Patent Literature 1).

[Patent Literature 1] JP-A-2009-231356

SUMMARY OF THE INVENTION

However, thermal process is always performed when bonding a conductive substrate and mounting a semiconductor light emitting element. As a result, the insulating layer made of $SiO_2$ and the like may be delaminated from the interface between it and the semiconductor layer which exhibits relatively weak adhesion due to thermal expansion.

The present invention has been made under these circumstances and is aimed to provide a semiconductor light emitting element which exhibits improved adhesion between the insulating layer and the semiconductor layer while allowing the insulating layer to control current flow within the semiconductor light emitting element.

According to the present invention, aforementioned problem is solved by the following means.

A semiconductor light emitting element according to the present invention comprises a semiconductor layer, a first electrode and a second electrode arranged to interpose the semiconductor layer therebetween, an insulating layer provided to the semiconductor layer at the same side as the second electrode and opposite to the first electrode so as to surround a periphery of the second electrode, and a first metal layer covering the second electrode and the insulating layer, wherein a second metal layer having a thickness smaller than that of the second electrode is provided between the semiconductor layer and the insulating layer.

As described above, an adhesion between the insulating layer and the semiconductor layer can be improved by providing the second metal layer having a thickness smaller than that of the second electrode between the semiconductor layer and the insulating layer without impairing a function of the insulating layer to control current flow and to effectively inject current to the semiconductor layer.

Furthermore, the thickness of the second metal layer is preferably 5.0 nm or less. This allows the insulating layer to control current flow effectively, and can suppress the reduction of light output due to light absorption by the second metal layer.

In addition, the second metal layer may be in a shape of islands, which allows the insulating layer to control current flow more effectively, and can diffuse and reflect the light from the semiconductor layer to improve light extraction efficiency.

According to the semiconductor light emitting element of the present invention, there can be provided the semiconductor light emitting element having improved adhesion between the insulating layer and the semiconductor layer while allowing the insulating layer to control current flow within the semiconductor light emitting element.

BRIEF DESCRIPTION OF THE DRAWINGS

FIG. 3 (b) is a schematic cross-sectional view showing a semiconductor light emitting element for comparing current flow with that of the first embodiment.

DETAILED DESCRIPTION OF THE INVENTION

Hereinafter, embodiments of the semiconductor light emitting element according to the present invention are described in detail. However, components presented in claims are never specified to those in the embodiments. Dimensions, materials, shapes and relative arrangement of the components described in the embodiments are not intended to limit the scope of the present invention only to them unless specifically described, but they are merely illustrative explanations. In addition, dimensions, relative positions and the like of the components shown in each drawing may be exaggerated in order to make explanations clear. Further, the same names and signs indicate the same or comparable components in the description below and detailed description is optionally omitted.

First Embodiment

Figure 1:
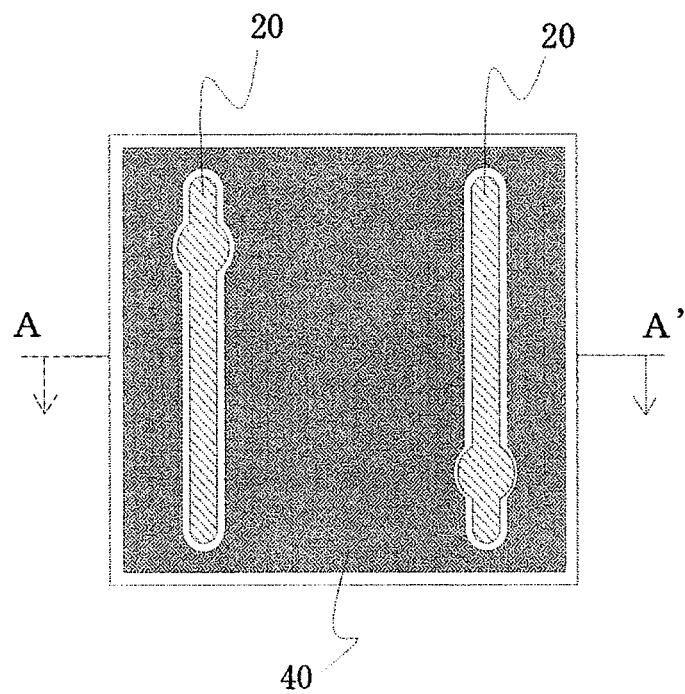
FIG. 1 is a schematic plan view showing a semiconductor light emitting element according to a first embodiment.
Figure 2:
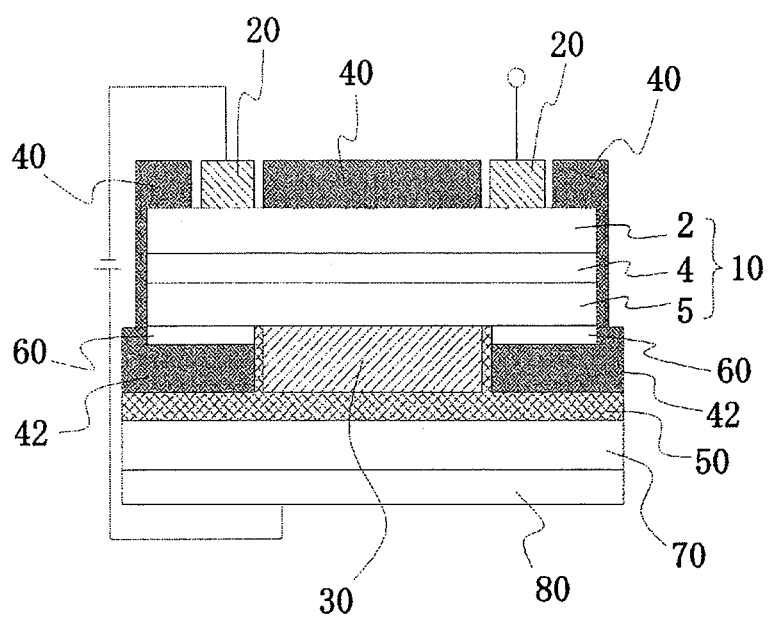
FIG. 2 is a schematic cross-sectional view taken along line A-A' in FIG. 1 showing the semiconductor light emitting element according to the first embodiment.
Figure 3:
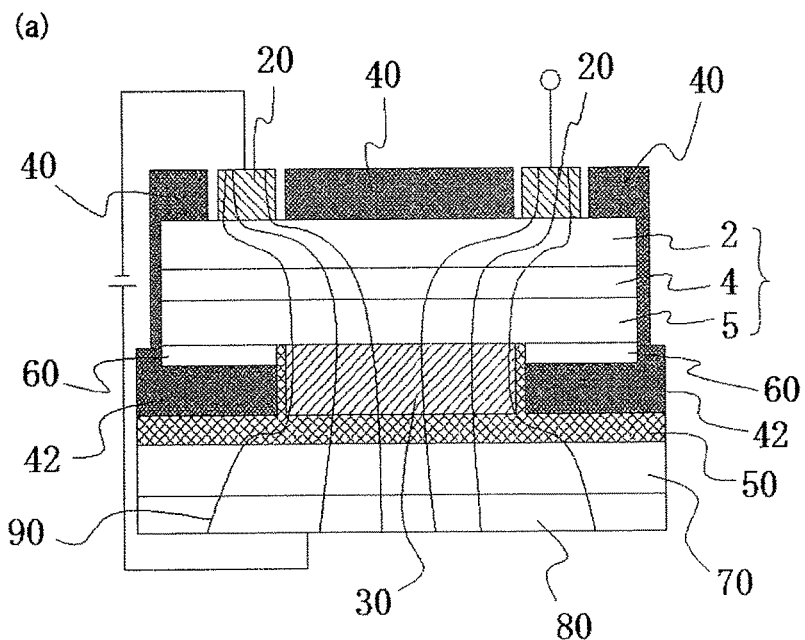
FIG. 3 (a) is a cross-sectional view schematically showing current flow in the semiconductor light emitting element according to the first embodiment.
Figure 3:
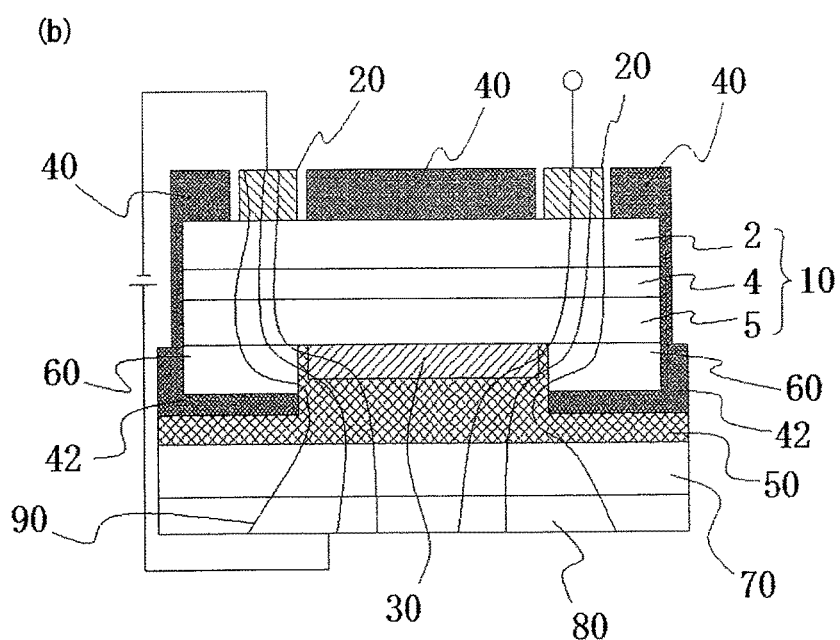

FIG. 1 is a schematic plan view showing a semiconductor light emitting element according to the first embodiment. FIG. 2 is a schematic cross-sectional view taken along line A-A' in FIG. 1 showing the semiconductor light emitting element according to the first embodiment. FIG. 3a is a cross-sectional view schematically showing current flow in the semiconductor light emitting element according to the first embodiment. FIG. 3b is a schematic cross-sectional view showing a semiconductor light emitting element for comparing current flow with that of the first embodiment.

A semiconductor light emitting element according to the first embodiment comprises at least a semiconductor layer 10, a first electrode(S) 20 and a second electrode 30 arranged to interpose the semiconductor layer 10 therebetween, an insulating layer 42 provided to the semiconductor layer 10 at the same side as the second electrode 30 and adjacent to it, and opposite to the first electrode 20, and a first metal layer 50 covering the second electrode 30 and the insulating layer 42. And the insulating layer 42 is provided with a second metal layer having a thickness smaller than that of the second electrode 30 on the surface which contacts with the semiconductor layer 10.

More particularly, the semiconductor layer 10 in the present embodiment comprises a first conductivity type semiconductor layer 2, a light emitting layer 4 and a second conductivity type semiconductor layer 5 in this order from the side of light extraction surface (upper surface side) toward the side of light reflection surface (lower surface side) of the semiconductor light emitting element. The first conductivity type semiconductor layer 2 is connected with the first electrode 20 on the side of light extraction surface (the side opposite to a surface having contact with the light emitting layer) and furthermore, provided with a protective layer 40 so as to expose at least a part of the first electrode 20. In addition, the second conductivity type semiconductor layer 5 is connected with the second electrode 30 on the side of light reflection surface (the side opposite to a surface having contact with the light emitting layer) and provided with the insulating layer 42 so as to surround the periphery of the second electrode 30 and to separate from the second electrode 30. The first electrode and the second electrode are arranged to interpose the semiconductor layer therebetween and not to overlap with each other in planar view of the semiconductor layer. That is, they are arranged not to place a part or whole of the second electrode on the region opposite to the first electrode with the semiconductor layer interposed in between. This arrangement can concentrate the current mainly just below the protective layer 40 by suppressing current injection to just below the first electrode 20, and can reduce the light absorbed by the first electrode 20. The protective layer 40 and the insulating layer 42 in the present embodiment are in the form of the integrated component and provided continuously without an interface along the lateral side of the semiconductor layer 10. The insulating layer 42 is arranged opposite to the first electrode 20 with the semiconductor layer 10 interposed in between, and provided with the second metal layer 60 having higher adhesion with the semiconductor layer 10 than that of the insulating layer 42, on the surface having contact with the semiconductor layer 10 (lower surface of the second conductivity type semiconductor layer 5). The thickness of the second metal layer 60 is smaller than that of the second electrode 30, preferably 100 nm or less, more preferably from 0.5 nm to 5 nm. By means of decreasing the thickness of the second metal layer 60 in this manner, a resistance in lateral direction of the second metal layer 60 can be increased and lateral current diffusion in the second electrode can be suppressed. Particularly in the case of the thickness of 5 nm or less, the current can be controlled effectively by the insulating layer, and the decrease of light output due the absorption of the light from the semiconductor layer 10 by the second metal layer 60 can be suppressed. In addition, the first metal layer is provided so as to cover the lower surface of the second electrode 30 and the insulating layer 42, and is electrically connected with the second electrode 30. Further, the first metal layer 50 is provided so as to fill the separated part between the second electrode 30 and the insulating layer 42 and also the second metal layer 60. In addition, a conductive substrate 70 and a metalization layer 80 are provided in this order on the lower surface of the first metal layer 50.

The semiconductor light emitting element according to the first embodiment having the aforementioned configuration can achieve the improved adhesion between the insulating layer 42 and the semiconductor layer 10 since the insulating layer 42 is provided to the semiconductor layer 10 via the second metal layer 60 of which adhesion to the semiconductor layer 10 is high.

Further, the second metal layer 60 according to the present embodiment has a thickness smaller than that of the second electrode 30, so that the sheet resistance of the second metal layer 60 can be higher than that of the second electrode 30. Thus, a concentration of current between the second metal layer 60 and the first electrode 20 due to much current flowing into the second metal layer 60 as shown in FIG. 3b does not occur, but current flowing into the second metal layer 60 is reduced and current can be injected effectively to the semiconductor layer as shown in FIG. 3a. Furthermore, this arrangement prevents a concentration of luminescence just below the first electrode 20 and can reduce the light absorbed by the first electrode 20, so that the light can be extracted effectively from the semiconductor light emitting element to the outside.

Therefore, the semiconductor light emitting element according to the first embodiment can improve an adhesion between the insulating layer 42 and the semiconductor layer 10 while allowing the insulating layer 42 to sufficiently control current flow within the semiconductor light emitting element.

Second Embodiment

Figure 4:
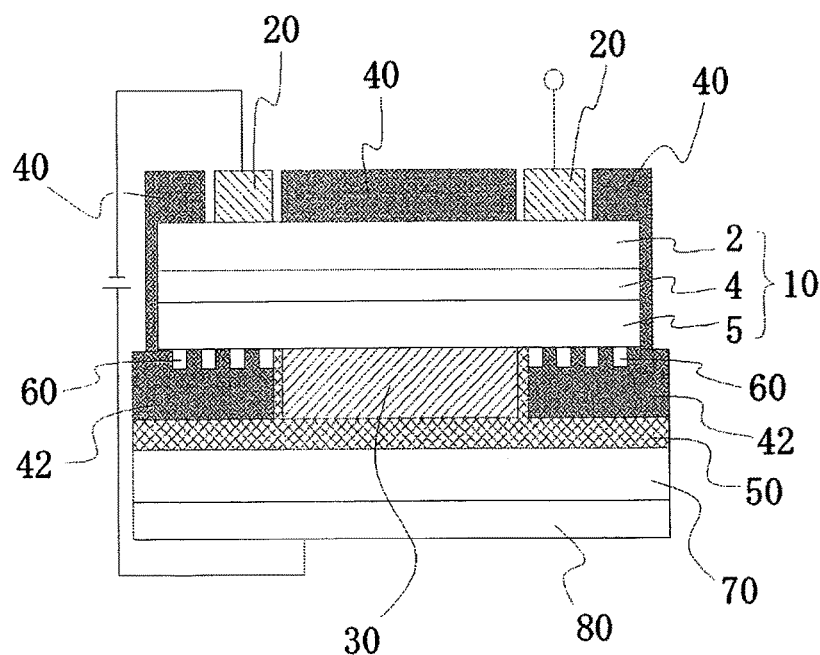
FIG. 4 is a schematic cross-sectional view showing a semiconductor light emitting element according to a second embodiment.

FIG. 4 is a schematic cross-sectional view showing a semiconductor light emitting element according to the second embodiment.

The semiconductor light emitting element according to the second embodiment has substantially the same structure as that of the first embodiment except for the shape of the second metal layer. Explanations are partly omitted with respect to the same structure.

The semiconductor light emitting element according to the present embodiment comprises at least a semiconductor layer 10, a first electrode(s) 20, a second electrode 30, a protective layer 40, an insulating layer 42, a first metal layer 50, a second metal layer 60, a conductive substrate 70 and a metalization layer 80.

On the upper surface of the semiconductor layer 10, the first electrode 20 is connected and further, the protective layer 40 is provided so as to expose a part of the first electrode 20. On the surface opposite to the surface on which the first electrode 20 is provided (lower surface) in the semiconductor layer 10, the second electrode 30 is connected, and the insulating layer 42 is provided adjacent to the second electrode 30. This insulating layer 42 is arranged opposite to the first electrode 20 with the semiconductor layer 10 interposed in between. The protective layer 40 and the insulating layer 42 are in the form of the integrated component continuously along the lateral side of the semiconductor layer 10. In addition, the second metal layer 60 having higher adhesion with the semiconductor layer 10 than that of the insulating layer 42 is provided between the insulating layer 42 and the semiconductor layer 10, and connects the insulating layer 42 and the semiconductor layer 10. The second metal layer 60 has a thickness smaller than that of the adjacent second electrode 30 in order not to impair the current control by the insulating layer 42. Particularly, the second metal layer 60 in the present embodiment is provided in a shape of islands, and the insulating layer 42 is arranged so as to fill gaps between the respective second metal layers separating from each other. That is, the lower side of the semiconductor layer 10 is in a state of having contact with both the second metal layer 60 and the insulating layer 42. In addition, the second electrode 30 is connected with the first metal layer 50 at its lateral side and lower side. This first metal layer 50 is extended to the lower surface of the insulating layer 42 so as to cover it. And the conductive substrate 70 and the metalization layer 80 are provided in this order on the lower surface of the first metal layer 50.

The semiconductor light emitting element according to the second embodiment having the aforementioned configuration can achieve the improved adhesion between the insulating layer 42 and the semiconductor layer 10 while maintaining current flow controlled by the insulating layer 42 as is the case with the semiconductor light emitting element according to the first embodiment. That is, current flowing into the second metal layer 60 can be reduced in the semiconductor light emitting element according to the present embodiment since the insulating layer 42 is arranged between the second metal layers 60 in the shape of islands. Thus, an occurrence of current concentration between the second metal layer 60 and the first electrode 20 can be further suppressed.

Furthermore, in the semiconductor light emitting element according to the present embodiment, the light from the semiconductor light emitting element can be effectively extracted to the outside since the light from the semiconductor layer 10 is diffused and reflected by the second metal layer 60 due to the second metal layer 60 in the shape of islands.

Hereinafter, each configuration of an embodiment according to the present invention is described in detail.
(Semiconductor Layer)

The semiconductor layer consists of at least a first conductivity type semiconductor layer, a light emitting layer and a second conductivity type semiconductor layer, and gallium nitride-based semiconductor materials such as $In_X Al_Y Ga_{1-X-Y} N$ ($0 \leq X$, $0 \leq Y$, $X+Y \leq 1$) are preferably used.

The first conductivity type semiconductor layer and the second conductivity type semiconductor layer are formed as an n-type or p-type semiconductor layer by a dopant into a layer made of semiconductor materials such as GaN, AlN and InN. N-type dopant includes IV group or VI group elements such as Si, Ge, Sn, S, O, Ti and Zr, and p-type dopant includes Be, Zn, Mn, Cr, Mg, Ca and the like.

In addition, the light emitting layer is a layer which emits energy as a light, which is generated by a recombination of holes and electrons injected from the first conductivity type semiconductor layer and the second conductivity type semiconductor layer. As such light emitting layer, any of undoped, n-type impurity-doped and p-type impurity-doped layer can be used.
(First Electrode and Second Electrode)

The first electrode and the second electrode are provided in contact with the semiconductor layer, and they are components for supplying current to the semiconductor layer.

The first electrode and the second electrode are arranged to interpose the semiconductor layer therebetween and not to overlap with each other in planar view of the semiconductor layer. That is, the first electrode and the second electrode are arranged alternately in planar view of the semiconductor layer. This arrangement can prevent current flowing between the first electrode and the second electrode from flowing through the shortest path within the semiconductor layer, and prevent the semiconductor light emitting element from being destroyed by excessive concentration of current. Further, an area of the second electrode is preferably designed to be larger than that of the first electrode. With this arrangement, an area of the current injection region can be set larger, so that the luminous efficiency can be improved. And also, heat generated by driving the semiconductor light emitting element can be released effectively. Particularly regarding heat release property, it is advantageous in case the second electrode is arranged on the side at which the semiconductor light emitting element is mounted.

As such first electrode, any of metal materials such as Ag, Pt, Au, Ni, Ti, Cr, W, Rh, Ru and Hf can be used and a plurality of these metal materials can be used and laminated. For example, it can be provided as Ti/Pt/Au, or Ti/Rh/W/Au, Cr/Pt/Ru/Au or the like in this order from the side of the first conductivity type semiconductor layer; however, it is not limited to the above arrangement.

In addition, it is advantageous to the improvement of light extraction efficiency that the second electrode is formed from Ag, Al, Pt, Au, Ni, Ti, Rh and the like, and particularly, consists of a light reflective material(s) such as Ag, Al and Rh. The second electrode can be also provided by laminating a plurality of metal materials as Ag/Ti/Pt or Al/Ti/Pt, Ag/Ni/Ti/Pt or the like in this order from the side of the second conductivity type semiconductor layer. In this case, it is preferable to provide an Ag layer as the closest layer to the side of the second conductivity type semiconductor layer since it can reflect the light from the light emitting layer effectively.
(Protective Layer)

The protective layer functions to protect mainly the semiconductor layer against external environment by covering the surface of the semiconductor layer.

Specifically, the protective layer is formed except on a part of the first electrode, that is, a region to which conductive components such as wires for supplying current are connected. The protective layer is made of translucent insulating film of oxides of Si, Ti, Ta and the like, and can be formed by known methods such as vapor deposition method and spattering. The thickness of the protective layer is not specifically limited, but is preferably 100-1000 nm.

(Insulating Layer)

The insulating layer is a component for controlling current flow pouring into the semiconductor layer to prevent current from flowing through the shortest path within the semiconductor layer.

The insulating layer is arranged opposite to the first electrode with the semiconductor layer interposed in between, and further, arranged to surround and separate from the periphery of the second electrode which is adjacent to the insulating layer at the same surface side. A metal material(s) or alloy material(s) which form the first metal layer as described hereinafter fill the separated region between this second electrode and the insulating layer; however, the present invention is not limited thereto. That is, the first metal layer may be provided so as to cover the lower surface side of the second electrode and the insulating layer so that a void is formed in the separated region. By this arrangement, even if a stress due to thermal expansion of the insulating layer occurs, the stress can be eased by the void, and therefore, the decrease of the adhesion between the semiconductor layer and the insulating layer can be suppressed. Further, the distance between the second electrode and the insulating layer is preferably about 10 μm or less since too large distance impairs the light extraction efficiency.

As such insulating layer, any of insulating materials such as $SiO_2$, SiN, $Al_2O_3$, ZnO, $ZrO_2$, $Nb_2O_5$ and $TiO_2$ can be used, and $TiO_2$ is particularly preferable since it can reflect the light from the light emitting layer effectively. Further, the insulating layer may be formed by laminating a plurality of insulating materials as is the case with the dielectric multilayer film, and the thickness of each layer may be set so as to reflect the light from the semiconductor layer.

The protective layer and the insulating layer in the present embodiment are in the form of the integrated component and provided continuously without an interface along the lateral side of the semiconductor layer; however, they are not limited to the aforementioned arrangement and can be in the form of the separate components.

(First Metal Layer)

The first metal layer is a component for bonding (coupling) the second electrode and the insulating layer with the conductive substrate described hereinafter.

The first metal layer is continuously provided so as to cover the second electrode and the insulating layer. Particularly, in case the second electrode is divided into several pieces, the respective second electrodes can be electrically connected to each other via the first metal layer.

With respect to such first metal layer, it is preferable to take into consideration the adhesion with the second electrode as well as the effects for ohmic property between the second electrode and the semiconductor layer (particularly, the second conductivity type semiconductor layer) and for the resistance of the second electrode. That is, the first metal layer, depending on its materials, could cause the deterioration of the ohmic property and the increase of the resistance by, for example, diffusing into the second electrode. Therefore, the first metal layer preferably comprises Ru, Rh, Os, Ir, Pt, W, Mo and the like which have high melting point. Particularly in case the first metal layer comprises Ti, Au, Sn, Pd and the like which have a melting point lower than the above-mentioned metals, it is preferable to arrange Ru, Rh, Os, Ir, Pt, W, Mo and the like at the first metal layer side, rather than these low melting point materials. This arrangement can suppress the diffusion of the metal materials comprised in the first metal layer into the second electrode even under the high temperature condition, for example, when bonding the conductive substrate and the like or when driving the element.

In addition, a third metal layer can also be provided between the first metal layer and the insulating layer. Preferably, such third metal layer is selected considering materials of the insulating layer. For example, in case the insulating layer is $SiO_2$, SiN and/or $Nb_2O_5$, the third metal layer comprising Ti and/or Ni at the side having contact with the insulating layer can achieve high adhesion, and can be difficult to tear. Specifically, it can be provided as Ti/Pt or Ti/Rh, Ti/Ir, Ni/Pt, Ni/Rh, Ni/Ir or the like in this order from the side of the insulating layer with the total thickness of about tens to hundreds of nanometers. Further, third metal layer can comprise a common element(s) with the insulating layer. It preferably comprises Nb when the insulating layer is niobium oxide, or comprises Ta when the insulating layer is tantalum oxide. Furthermore, third metal layer is preferably selected considering the adhesion with the first metal layer.

(Second Metal Layer)

The second metal layer is a component for improving an adhesion between the insulating layer and the semiconductor layer while maintaining current flow controlled by the insulating layer.

The second metal layer is provided so as to connect the insulating layer and the semiconductor layer and has a thickness smaller than that of the adjacent second electrode. Particularly in case the second electrode is in the form of laminated layers of a plurality of metal materials, the thickness of the second metal layer is preferably smaller than that of the closest layer of the second electrode to the semiconductor layer side. With this arrangement, current flow pouring into the second metal layer can be further reduced.

In addition, in case the insulating layer is provided with an insulating material having high reflectance such as $TiO_2$ at a layer closest to the semiconductor layer, the second metal layer is preferably translucent, and specifically, has a thickness of preferably 1.5 nm or less, more preferably 0.5 nm or less. With this arrangement, the light passing through the second metal layer is reflected by the insulating layer, so that the semiconductor light emitting element can achieve the improved light extraction efficiency.

For such second metal layers, materials having good adhesion with both the semiconductor layer and the insulating layer are preferable, which include metal materials such as Ti, Ni, Cr, Ta, Nb and Al. Furthermore, metal materials which have schottky contact with the semiconductor layer, such as Ru, Rh, Pt and Co, may be used for the second metal layer. As a result, the current flowing into the second metal layer can be reduced without being affected by the thickness of the second metal layer. However, this arrangement may be combined with the aforementioned relation between the thickness of the second metal layer and that of the second electrode in order to further reduce current flowing into the second metal layer.

(Conductive Substrate)

The conductive substrate consists of, for example, silicon (Si). Further, in addition to Si, semiconductor materials such as Ge, SiC, GaN, GaAs, GaP, InP, ZnSe, ZnS and ZnO and metal materials such as Ag, Cu, Au, Pt, W, Mo, Cr and Ni can be used. In addition, a bonding layer made of Ti, Pt, Au and the like can be also provided on the conductive substrate at the closer side to the semiconductor layer in order to enhance the adhesion with the first metal layer. Furthermore, a metalization layer made of Ti, Pt, Au and the like is provided similarly on the conductive substrate at the other side opposite to the semiconductor layer (mounting side of the semiconductor light emitting element) and it can enhance the adhesion when mounting the semiconductor light emitting element.

(Method for Manufacturing the Semiconductor Light Emitting Element)

Figure 6:
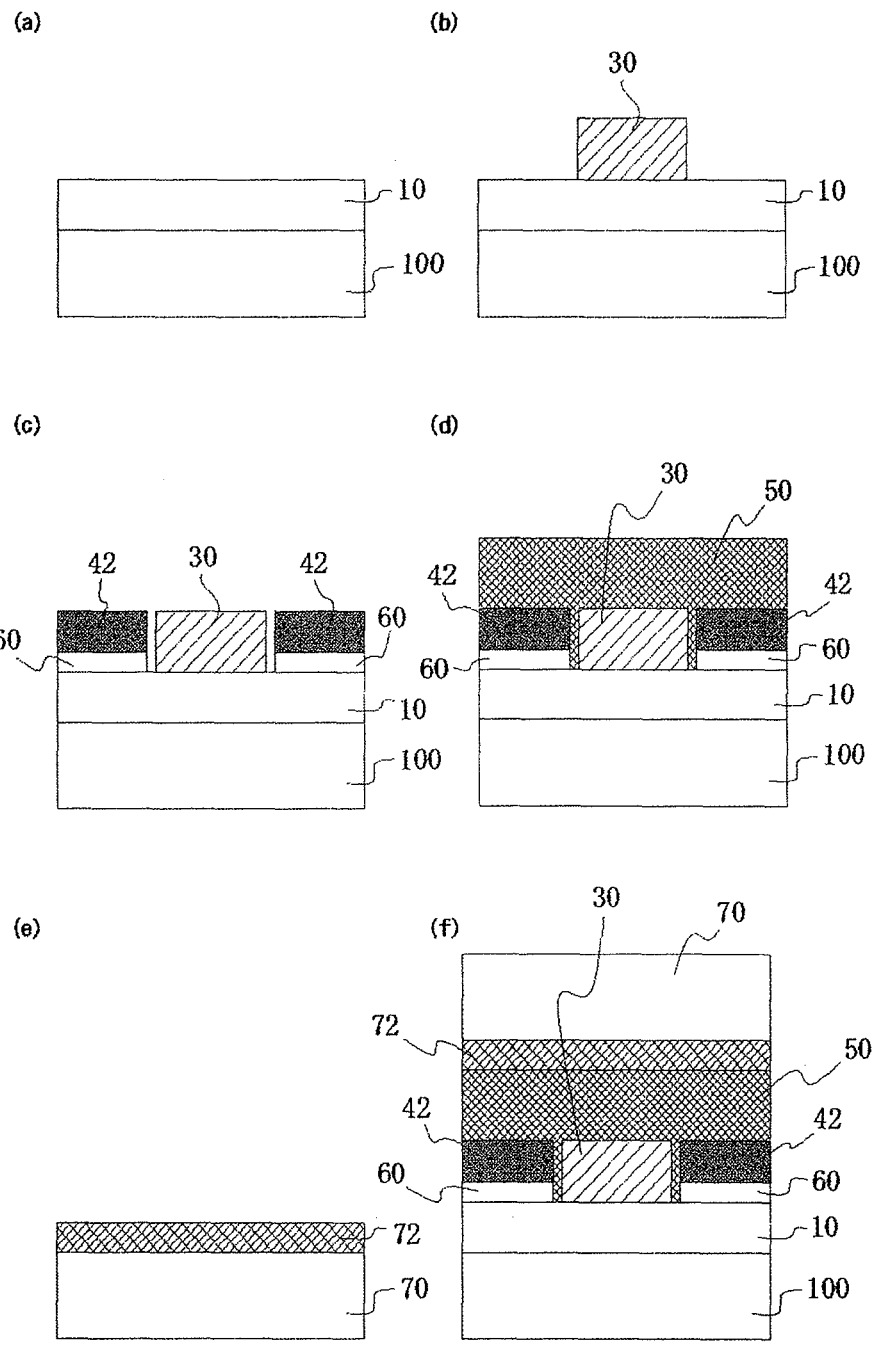
FIGS. 6 (a)-(f) are cross-sectional views schematically illustrating a process for manufacturing the semiconductor light emitting element according to the first embodiment.
Figure 7:
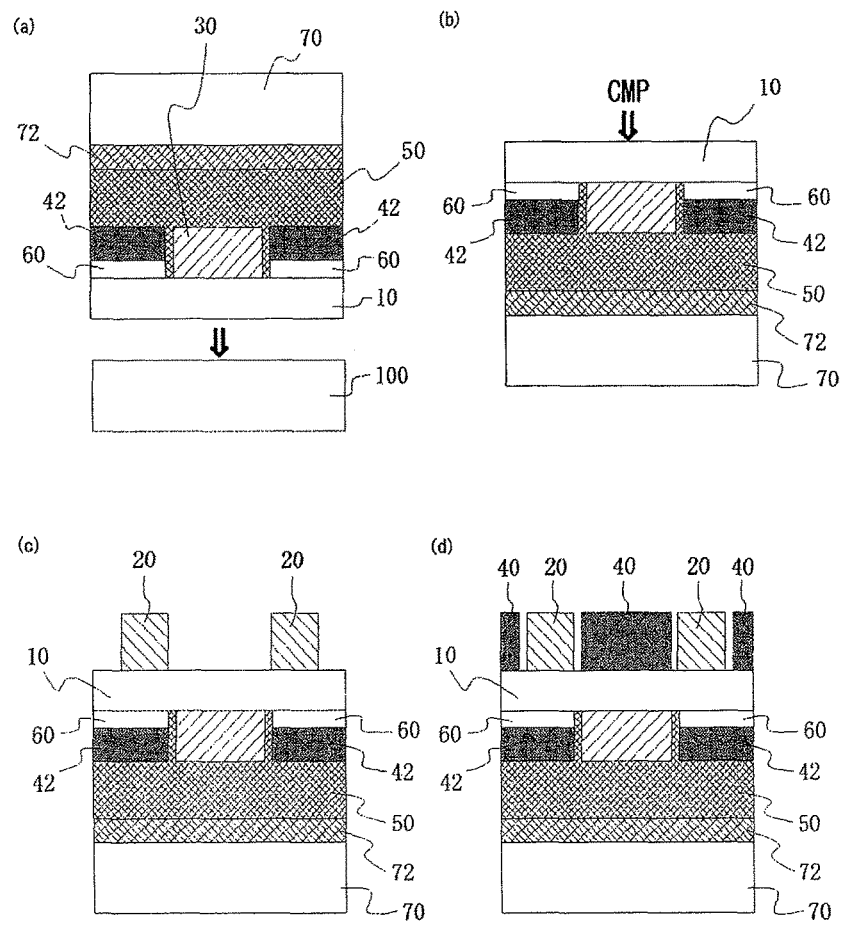
FIGS. 7 (a)-(d) are cross-sectional views schematically illustrating a process for manufacturing the semiconductor light emitting element according to the first embodiment.

A method for manufacturing a semiconductor light emitting element according to the present embodiment is explained by following the sequential steps shown in FIG. 6 and FIG. 7. FIG. 6 and FIG. 7 are cross-sectional views schematically showing a method for manufacturing the semiconductor light emitting element according to the first embodiment.

First, as shown in FIG. 6, in the semiconductor light emitting element in the present embodiment, the first conductivity type semiconductor layer, the light emitting layer and the second conductivity type semiconductor layer are formed in this order on a growth substrate 100 made of sapphire or the like to form a semiconductor layer 10.

Next, the second electrode 30 is created by forming a photomask corresponding to the arrangement of the second electrode 30 on the upper surface of the second conductivity type semiconductor layer by use of a resist, and by laminating electrode materials comprising, for example, Ag and Pt by means of sputtering or the like. Subsequently, the photomask is further formed on the second electrode 30 by use of the resist, a metal material such as Ti is laminated by sputtering or the like followed by laminating a semiconductor material such as $SiO_2$ and then, the resist is removed. As a result, a configuration can be formed in which the second electrode 30 is laminated and the second metal layer 60 and the insulating layer 42 is laminated so as to separate from the second electrode 30. Alternatively, the formation can be also carried out by a method in which an insulating material such as $SiO_2$ is stacked over the entire surface of the second conductivity type semiconductor layer, and then a photomask corresponding to the arrangement of the insulating layer 42 is formed on the film of the insulating material, a region corresponding to the arrangement of the second electrode 30 is wet-etched, and an electrode materials are laminated on the etched region by sputtering or the like to form the second electrode 30.

Next, the first metal layer 50 comprising Pt, Au, Sn and the like is formed on the top of the insulating layer 42 and the second electrode 30 so that the separated region between the insulating layer 42 and the second electrode 30 is also filled with the first metal layer 50.

Meanwhile, a conductive substrate 70 such as Si is prepared, and a bonding layer 72 comprising Pt, Au, Ti and the like is formed on the upper surface of the conducting substrate 70.

Next, the first metal layer 50 and the bonding layer 72 are connected by laminating them together and heating them at approximately 150-350° C. By this, eutectic is formed from a part of the first metal layer 50 and a part of the bonding layer 72, so that the semiconductor layer 10 and the conductive substrate 70 are adhered with each other.

Next, as shown in FIG. 7, the growth substrate 100 is removed by performing, for example, laser radiation or polishing from the side of the growth substrate 100, followed by the chemical mechanical polishing (CMP) of the exposed semiconductor layer 10 (first conductivity type semiconductor layer). Further, a mask is formed on the polished surface so as to form the first electrode 20 on a region which is opposite to the insulating layer 42 with the semiconductor layer 10 interposing in between and which is not overlapped with the second electrode 30. And then, an electrode material(s) is laminated by, for example, sputtering to form the first electrode 20 on the semiconductor layer 10. Here, the region on which the mask is provided, that is, the region on which the first electrode 20 is not formed is perforated by RIE (reactive ion etching) to expose the semiconductor layer 10. Subsequently, the protective layer 40 is formed on the exposed semiconductor layer 10, so that the semiconductor light emitting element in the present embodiment can be obtained.

EXAMPLES

Semiconductor light emitting elements (Examples 1-4 and Comparative Example 1) are prepared, and the adhesion between the insulating layer and the semiconductor layer as well as the initial characteristics is evaluated. The present invention is not limited to these Examples.

Example 1

Figure 5:
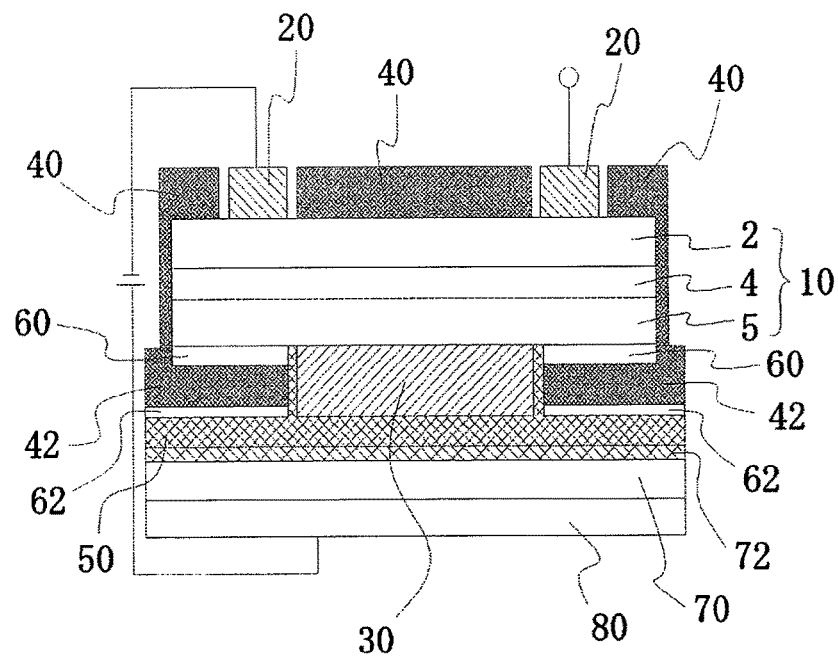
FIG. 5 is a schematic cross-sectional view showing a semiconductor light emitting element according to Example 1.

For Example 1, as shown in FIG. 5, a semiconductor light emitting element according to the first embodiment is prepared with the following design.

The semiconductor light emitting element of Example 1 comprises at least a semiconductor layer 10, a first electrode (n-electrode) 20, a second electrode (p-electrode) 30, a protective layer 40, an insulating layer 42, a first metal layer 50, a second metal layer 60, a third metal layer 62, a conductive substrate 70, a bonding layer 72 and a metalization layer 80.

More specifically, gallium nitride-based semiconductor as the semiconductor layer 10, Ti (15 nm)/Pt (200 nm)/Au (1000 nm) as the first electrode 20, Ag (100 nm)/Ni (100 nm)/Ti (100 nm)/Pt (100 nm) as the second electrode 30, $SiO_2$ (400 nm) as the protective layer 40, $SiO_2$ (300 nm) as the insulating layer 42, Pt (300 nm)/Au (300 nm)/AuSn (2000 nm) as the first metal layer 50, Ti (0.5 nm) as the second metal layer 60, Ti (50 nm)/Pt (50 nm) as the third metal layer 62, Au (500 nm)/Pt (300 nm)/$TiSi_2$ (5 nm) as the bonding layer 72, Si substrate as the conductive substrate 70 and Pt (250 nm)/Au (500 nm) as the metalization layer 80 are used.

The semiconductor light emitting element of the present example is provided with the first electrode 20 and the second electrode 30 interposing the semiconductor layer 10 in between such that the first electrode 20 and the second electrode 30 are not overlapped in planar view of the semiconductor layer. The protective layer 40 is provided on the surface of the semiconductor layer at the side having the first electrode 20 (upper surface). The protective layer 40 is arranged to expose a part of the first electrode 20 in order to be able to connect to a conductive component such as wires. In addition, the second metal layer 60 is provided adjacent to and separating from the second electrode 30 on the surface of the semiconductor layer at the side having the second electrode 30 (lower surface). Further, the second metal layer 60 is arranged to opposite to the first electrode 20 with the semiconductor layer 10 interposed in between. In this case, the thickness of the second metal layer 60 is smaller than that of the second electrode 30. Particularly in the present example, the second metal layer 60 has a thickness smaller than that of the Ag layer which is the first layer (the closest layer to the semiconductor layer) constituting the second electrode 30, so that the current flowing into the second metal layer 60 can be further reduced. The insulating layer 42 is laminated on the lower surface of the second metal layer 60, and the insulating layer 42 and the protective layer 40 are formed continuously along the lateral side of the semiconductor layer 10. On the lower surface of the insulating layer 42, the third metal layer 62 is laminated, which has a good adhesion with both the first metal layer 50 and the insulating layer 42. The first metal layer 50 has contact with the lower surface of the third metal layer 62 and has contact with the second electrode 30 so that the first metal layer 50 covers the periphery (the lateral side and the lower side) of the second electrode 30. The conductive substrate 70 is bonded on the first metal layer 50 via the bonding layer 72, and further, the metalization layer 80 is provided on the lower surface of the conductive substrate 70.

As described above, the semiconductor light emitting element according to Example 1 can exhibit almost the same effect as that of the first embodiment.

Examples 2-4

Semiconductor light emitting elements of Examples 2-4 are prepared in a similar manner as in Example 1, except that the thickness of the second metal layer is 1.5 nm, 5 nm and 100 nm, respectively.

Comparative Example 1

A semiconductor light emitting element of Comparative Example 1 is prepared in a similar manner as in Example 1, except that a second metal layer is not provided between the insulating layer and the semiconductor layer.

Evaluations are carried out for the semiconductor light emitting elements prepared as described above.

Figure 8:
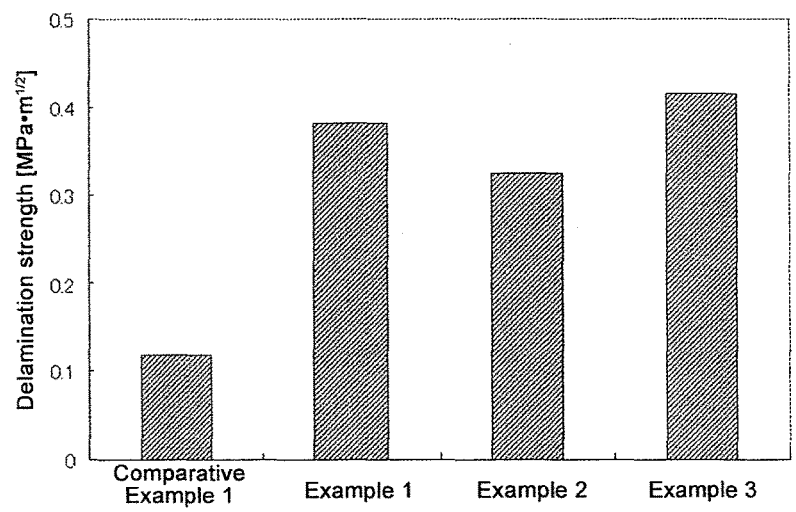
FIG. 8 is a graph showing delamination strength between the insulating layer and the semiconductor layer in Examples 1-3 and Comparative Example 1.
Figure 9:
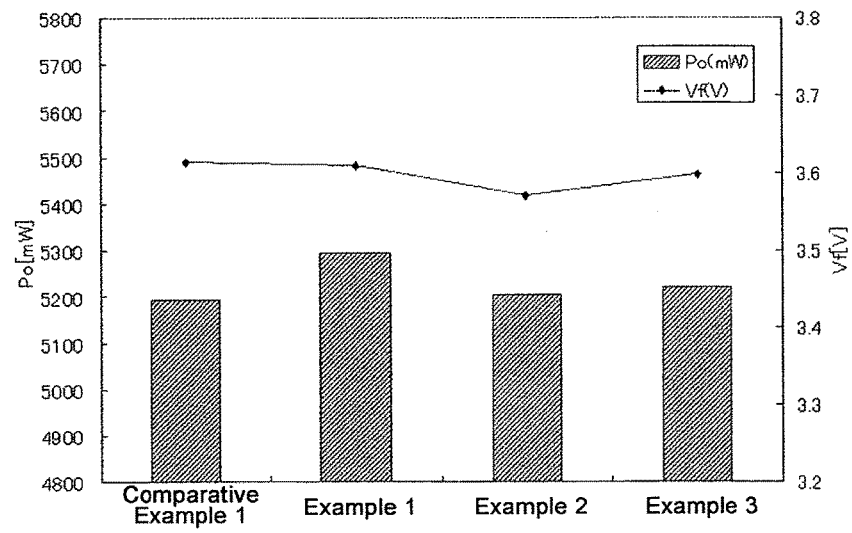
FIG. 9 is a graph showing Po (light output) and Vf (forward voltage) in Examples 1-3 and Comparative Example 1.
Figure 10:
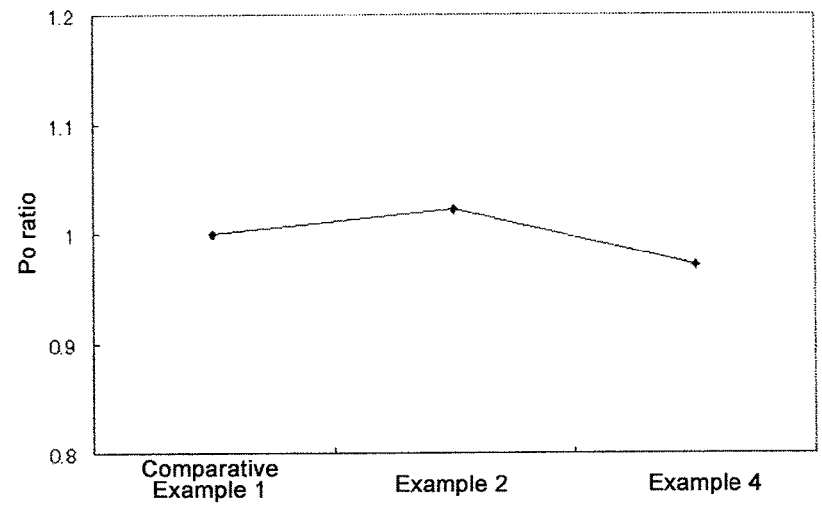
FIG. 10 is a graph showing Po (light output) ratio in Example 2 and Example 4.

FIG. 8 is a graph showing delamination strength between the insulating layer and the semiconductor layer in Examples 1-3 and Comparative Example 1. FIG. 9 is a graph showing Po (light output) and Vf (forward voltage) in Examples 1-3 and Comparative Example 1. FIG. 10 is a graph showing Po (light output) ratio in Example 2 and Example 4.

(Evaluation of the Adhesion Between the Insulating Layer and the Semiconductor Layer)

As to Examples 1-3 and Comparative Example 1, delamination strength between the insulating layer and the semiconductor layer was measured by using mELT (modified Edge Liftoff Test) method. The mELT method is a method in which epoxy resin is applied to a measurement sample and baked, the sample is diced into 10 mm square pieces followed by cooling with liquid nitrogen, and the adhesion is determined by the temperature at which the delamination of the film is observed. That is, delamination strength $K_{app}$ [MPa·m$^{1/2}$] is calculated by the equation below based on the residual stress σ of the epoxy resin at the temperature T at which the delamination occurs and the thickness h of the epoxy resin.

$$K_{app} = \sigma \cdot (h/2)^{1/2}$$

On a sample which was formed by growing GaN on sapphire, Ti layer as the second metal layer, SiO$_2$ layer of 300 nm as the insulating layer and Ti layer of 50 nm and Pt layer of 50 nm as the third metal layer were formed by means of the method as the above-mentioned Example 1. The thicknesses of Ti layer as the second metal layer were set to 0 nm, 0.5 nm, 1.5 nm and 5 nm, respectively corresponding to the thicknesses of the second metal layer in Comparative Example 1 and Examples 1-3, and each of them was used as the samples of Comparative Example 1 and Examples 1-3, respectively. Delamination strength $K_{app}$ of the respective samples prepared in this manner was measured. Results are shown in FIG. 8. Whereas delamination strength of the sample of Comparative Example 1 in which Ti was not formed was about 0.12 [MPa·m$^{1/2}$], delamination strength $K_{app}$ of the samples of Examples 1-3 in which Ti with film thickness of 0.5-5 nm was formed were about 0.32-0.42 [MPa·m$^{1/2}$] or more, and thus, the delamination strength was increased about threefold. From the above-mentioned results, it was found that the adhesion between the insulating layer and the semiconductor layer is improved by providing the second metal layer.

(Evaluation of the Initial Characteristics)

Next, Po (light output) and Vf (forward voltage) were measured in order to evaluate the initial characteristics of Examples 1-3 and Comparative Example 1. The current value used for this measurement is 4 A.

As shown in FIG. 9, there was almost no difference in Po values and Vf values among any of Examples 1-3 and Comparative Example 1. That is, it is found that current flow controlled by the insulating layer is not interfered by the second metal layer in Examples 1-3, and thus, the control is sufficiently carried out as is the case with Comparative Example 1. Furthermore, it is also found that the light from the semiconductor layer absorbed by the metal material constituting the second metal layer is reduced since the thickness of the second metal layer in Examples 1-3 is 5 nm or less and relatively small.

Next, Po of Example 4 is further measured and compared to that of Example 2 in order to evaluate the dependency on the thickness of the second metal layer. Results of the measurements are shown as ratio in which Po in Comparative Example 1 is defined as 1 for ease of comparison.

As shown in FIG. 10, decrease of Po is observed in Example 4 compared to Example 2. However, the difference is 0.05 or less and relatively small, and therefore, it is presumed that the decrease is not caused by the change in current flow controlled by the insulating layer but by increasing the absorbed amount of the light from the semiconductor layer with increasing the thickness of the second metal layer. As a result, it is confirmed that the thickness of the second metal layer is preferably less than 100 nm with which current can be controlled by the insulating layer, and more preferably 5 nm or less with which light absorption is decreased.

The semiconductor light emitting element of the present invention is applicable to general lightings as well as various light sources such as backlights of car navigation equipments, headlights of automobiles, traffic lights and large-sized displays.

The invention claimed is:
1. A semiconductor light emitting element comprising:
   a semiconductor layer;
   a first electrode and a second electrode arranged to interpose the semiconductor layer therebetween;
   an insulating layer provided to the semiconductor layer at the same side as the second electrode and opposite to the first electrode, the second electrode and the insulating layer are arranged not to overlap with each other in cross-sectional view of the semiconductor light emitting element;
   a first metal layer covering the second electrode and the insulating layer; and
   a second metal layer having a thickness smaller than a thickness of the second electrode is provided between the semiconductor layer and the insulating layer, wherein the first electrode is connected to an upper surface of the semiconductor layer, and further comprising a protective layer provided on the upper surface of the semiconductor layer so as to expose a part of the first electrode, wherein the second electrode is provided in direct contact with the semiconductor layer, wherein no second electrode contacting with the semiconductor layer is arranged to overlap with the first electrode contacting with the semiconductor layer when viewed in plan view of the semiconductor light emitting element, and wherein the second metal layer is in a shape of a plurality of islands provided on both sides of the second electrode such that the semiconductor layer partly has direct contact with the insulating layer.

2. The semiconductor light emitting element according to claim 1, wherein the thickness of the second metal layer is 5 nm or less.

3. The semiconductor light emitting element according to claim 1, wherein the insulating layer is arranged so as to surround outer peripheral sidewalls of the second electrode.

4. The semiconductor light emitting element according to claim 1, wherein the protective layer and the insulating layer are continuously formed along a lateral side of the semiconductor layer.

5. The semiconductor light emitting element according to claim 1, wherein the protective layer and the insulating layer are in the form of the integrated component.

6. The semiconductor light emitting element according to claim 1, wherein the insulating layer is formed of a material selected from $SiO_2$, SiN, $Al_2O_3$, ZnO, $ZrO_2$, $Nb_2O_5$ and $TiO_2$.

7. The semiconductor light emitting element according to claim 1, wherein the protective layer is formed of a material selected from $SiO_2$, SiN, $Al_2O_3$, ZnO, $ZrO_2$, $Nb_2O_5$ and $TiO_2$.

8. The semiconductor light emitting element according to claim 1, wherein the insulating layer is formed of $TiO_2$, and the thickness of the second metal layers is 1.5 nm or less.

9. The semiconductor light emitting element according to claim 1, wherein the first metal layer is formed of a metal material selected from Ru, Rh, Os, Ir, Pt, W and Mo.

10. The semiconductor light emitting element according to claim 1, the semiconductor light emitting element is a light emitting diode.

11. The semiconductor light emitting element according to claim 1,
wherein the insulating layer has an opening extending therethrough, and
wherein the second electrode is provided entirely within the opening of the insulating layer when viewed in cross-sectional view of the semiconductor light emitting element.

12. The semiconductor light emitting element according to claim 11,
wherein the second metal layer has an opening extending therethrough, and
wherein the second electrode is provided entirely within the opening of the second metal layer when viewed in cross-sectional view of the semiconductor light emitting element.

13. The semiconductor light emitting element according to claim 1,
wherein the second electrode is in the form of laminated layers of a plurality of metal materials, and wherein the thickness of the second metal layer is smaller than a thickness of a layer of the laminated layers of the second electrode that is closest to the semiconductor layer.

14. The semiconductor light emitting element according to claim 1, wherein the second metal layer is formed of a metal material selected from Ti, Ni, Cr, Ta, Nb, Al, Ru, Rh, Pt and Co.

15. The semiconductor light emitting element according to claim 14, wherein the second metal layer is formed of Ru, Rh, Pt or Co.

16. A semiconductor light emitting element comprising:
a semiconductor layer;
a first electrode and a second electrode arranged to interpose the semiconductor layer therebetween;
an insulating layer provided to the semiconductor layer at the same side as the second electrode and opposite to the first electrode so as to surround outer peripheral sidewalls of the second electrode;
a first metal layer covering the second electrode and the insulating layer; and
a second metal layer having a thickness smaller than a thickness of the second electrode is provided between the semiconductor layer and the insulating layer,
wherein the second electrode is provided in direct contact with the semiconductor layer,
wherein no second electrode contacting with the semiconductor layer is arranged to overlap with the first electrode contacting with the semiconductor layer when viewed in plan view of the semiconductor light emitting element, and
wherein the second metal layer is in a shape of a plurality of islands provided on both sides of the second electrode such that the semiconductor layer partly has direct contact with the insulating layer.

17. The semiconductor light emitting element according to claim 16, wherein the second metal layer is formed of Ru, Rh, Pt or Co.

18. A semiconductor light emitting element comprising:
a semiconductor layer;
a first electrode and a second electrode arranged to interpose the semiconductor layer therebetween, an upper surface area of the second electrode is larger than an upper surface area of the first electrode when viewed in cross-sectional view of the semiconductor light emitting element;
an insulating layer provided to the semiconductor layer at the same side as the second electrode and opposite to the first electrode;
a first metal layer covering the second electrode and the insulating layer; and
a second metal layer having a thickness smaller than a thickness of the second electrode is provided between the semiconductor layer and the insulating layer,
wherein the second electrode is provided in direct contact with the semiconductor layer,
wherein no second electrode contacting with the semiconductor layer is arranged to overlap with the first electrode contacting with the semiconductor layer when viewed in plan view of the semiconductor light emitting element, and
wherein the second metal layer is in a shape of a plurality of islands provided on both sides of the second electrode such that the semiconductor layer partly has direct contact with the insulating layer.

19. The semiconductor light emitting element according to claim 18, wherein the second metal layer is formed of Ru, Rh, Pt or Co.

* * * * *